US012756484B1

(12) United States Patent
Collins

(10) Patent No.: US 12,756,484 B1
(45) Date of Patent: Oct. 6, 2026

(54) RF OUTLET POWER TEST DEVICE

(71) Applicant: VeEX Inc., Fremont, CA (US)

(72) Inventor: Christopher C. Collins, Norcross, GA (US)

(73) Assignee: VeEX Inc., Fremont, CA (US)

( * ) Notice: Subject to any disclaimer, the term of this patent is extended or adjusted under 35 U.S.C. 154(b) by 1043 days.

(21) Appl. No.: 17/674,519

(22) Filed: Feb. 17, 2022

Related U.S. Application Data

(60) Provisional application No. 63/245,026, filed on Sep. 16, 2021.

(51) Int. Cl.
*H04B 17/318* (2015.01)
*G01R 21/00* (2006.01)
*H04L 12/28* (2006.01)

(52) U.S. Cl.
CPC .......... *H04B 17/318* (2015.01); *G01R 21/00* (2013.01); *H04L 12/2801* (2013.01)

(58) Field of Classification Search
CPC .... H04B 17/318; G01R 21/00; H04L 12/2801
See application file for complete search history.

(56) References Cited

U.S. PATENT DOCUMENTS

2002/0141212 A1* 10/2002 Ishida ............... H02M 7/53803 363/98
2015/0044980 A1* 2/2015 Eddowes ............. H03G 3/3068 455/226.2
2018/0248360 A1* 8/2018 Mori ..................... H04N 21/615
2021/0211984 A1* 7/2021 Ripley ................ H04W 52/346

FOREIGN PATENT DOCUMENTS

KR 100364322 * 12/2002
WO WO-02091325 A1 * 11/2002 ........... G08B 25/016
WO WO-2020105746 A1 * 5/2020 .......... H03M 7/3059

* cited by examiner

*Primary Examiner* — Sujoy K Kundu
*Assistant Examiner* — Raul Rivas
(74) *Attorney, Agent, or Firm* — Rimon Law, P.C.

(57) ABSTRACT

A device comprises a connector, couplable to an outlet; a diplexer, coupled to the connector, configured to pass a first frequency band associated with a first type of network communications and a second frequency band associated with a second type of network communications; and a processor, coupled to the diplexer, configured to: receive a power level of the first frequency band and a power level of the second frequency band, compare the power level of the first frequency band and a first threshold value associated with the first type of network communications, and compare the power level of the second frequency band and a second threshold value associated with the second type of network communications.

20 Claims, 6 Drawing Sheets

RF OUTLET POWER TEST DEVICE

CROSS-REFERENCE TO RELATED APPLICATIONS

This application claims priority to U.S. Provisional Patent Application No. 63/245,026, filed on Sep. 16, 2021 and entitled “RF Outlet Tester Device,” which is incorporated herein by reference in its entirety.

FIELD OF THE INVENTION

The present technology relates to network communications. More particularly, the present technology relates to testing of signals at an outlet for coaxial cabling.

BACKGROUND

Coaxial cables can support communications in a variety of contexts. One such context is communications that involve the home. For example, cable television (CaTV) is a system that delivers content programming to consumers at home via radio frequency (RF) signals transmitted through coaxial cables. As another example, Multimedia over Coax Alliance (MoCA) is a standards consortium that provides specifications for networking in a residence over coaxial cables.

SUMMARY

Various embodiments of the present technology can include a device comprising: a connector, couplable to an outlet; a diplexer, coupled to the connector, configured to pass a first frequency band associated with a first type of network communications and a second frequency band associated with a second type of network communications; and a processor, coupled to the diplexer, configured to: receive a power level of the first frequency band and a power level of the second frequency band, compare the power level of the first frequency band and a first threshold value associated with the first type of network communications, and compare the power level of the second frequency band and a second threshold value associated with the second type of network communications.

In some embodiments, the diplexer comprises a first filter configured to pass the first frequency band and a second filter configured to pass the second frequency band.

In some embodiments, the first filter is a band pass filter and the second filter is a band pass filter.

In some embodiments, the device further comprises: a first detector, coupled to the first filter and the processor, configured to determine a first DC voltage associated with the power level of the first frequency band; and a second detector, coupled to the first filter and the processor, configured to determine a second DC voltage associated with the power level of the second frequency band.

In some embodiments, the first detector is a first log amp and the second detector is a second log amp.

In some embodiments, the device further comprises: a power supply, coupled to the first detector, the second detector, and the processor; and a switch, coupled to the power supply, wherein activation of the switch enables operation of the device.

In some embodiments, the power level of the first frequency band is based on digitization of the first DC voltage and the power level of the second frequency band is based on digitization of the second DC voltage.

In some embodiments, the first threshold value and the second threshold value are configurable.

In some embodiments, the device further comprises: at least a first indicator, coupled to the processor, configured to indicate a result of a comparison between the power level of the first frequency band and the first threshold value; and at least a second indicator, coupled to the processor, configured to indicate a result of a comparison between the power level of the second frequency band and the second threshold value.

In some embodiments, the at least a first indicator comprises a first LED and the at least a second indicator comprises a second LED.

In some embodiments, the device is handheld.

In some embodiments, the connector is an F-type connector.

In some embodiments, the first type of network communications is associated with CaTV and the second type of network communications is associated with MoCA.

In some embodiments, the first frequency band is selected to be a subset of an entire spectrum associated with CaTV and the second frequency band is selected to be an entire spectrum associated with MoCA.

In some embodiments, the first threshold value is based on a minimum power level for each channel in the first frequency band and the second threshold value is based on a minimum power level of a beacon in the second frequency band.

In some embodiments, the first frequency band is selected to include channels provided by different cable companies in different geographical regions.

Various embodiments of the present technology can include a handheld device comprising: a connector, couplable to a coaxial cable outlet in a building; a multiplexer, coupled to the connector, configured to separate signals at the outlet into a plurality of frequency bands associated with a plurality of types of network communications, the plurality of types of network communications comprising at least one of CaTV or MoCA; a plurality of detectors, coupled to the multiplexer, configured to receive the plurality of frequency bands, each detector configured to measure a power level of a respective frequency band associated with a respective type of network communications; a processor, coupled to the plurality of detectors, configured to perform a comparison of the power level of each frequency band associated with a respective type of network communications with a threshold value associated with the respective type of network communications; and at least one indicator, coupled to the processor, configured to indicate sufficient or insufficient signal quality at the outlet for each type of network communications in response to the comparison.

In some embodiments, the handheld device further comprises a button associated with a switch coupled to the processor, wherein depression of the button when the handheld device is coupled to the outlet causes the handheld device to automatically perform a test to determine the adequacy of signals associated with the plurality of types of network communications at the outlet and to automatically indicate results of the test to a user of the handheld device.

Various embodiments of the present technology can include a system, method, and computer readable medium configured to receive, by a handheld device, a signal; separate the signal into a plurality of frequency bands associated with a plurality of types of network communications; detect a power level of each frequency band of the plurality of frequency bands; compare the detected power level of each frequency band with an associated threshold value; and indicate to a user of the handheld device whether the detected power level of each frequency band is sufficient for the associated type of network communications.

In some embodiments, the plurality of types of network communications comprise at least one of CaTV or MoCA.

It should be appreciated that many other features, applications, embodiments, and/or variations of the present technology will be apparent from the accompanying drawings and from the following detailed description. Additional and/or alternative implementations of the structures, systems, non-transitory computer readable media, and methods described herein can be employed without departing from the principles of the present technology.

Figure 1:
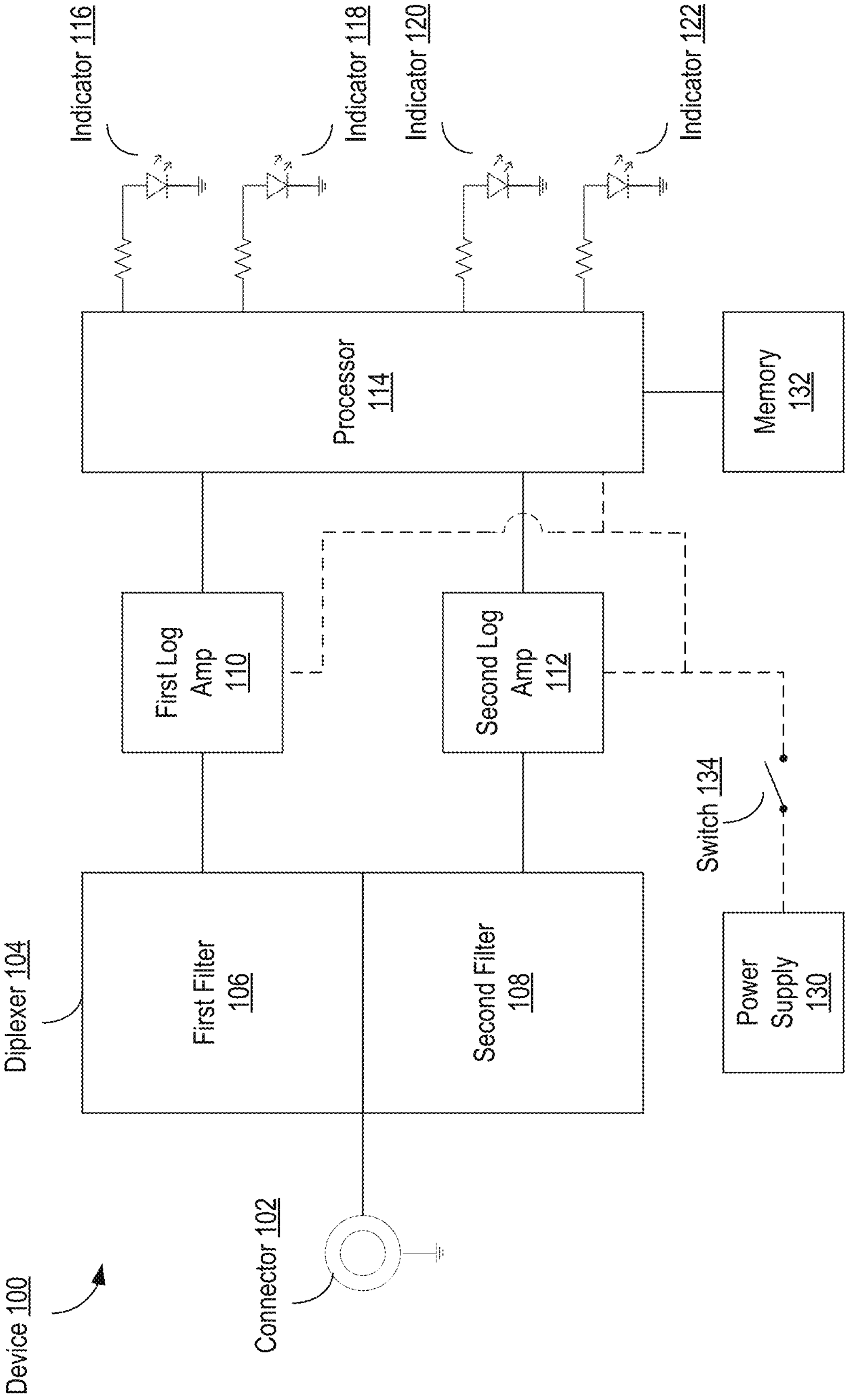
FIG. 1 illustrates a device in a first example configuration, according to various embodiments of the present technology.

The figures depict various embodiments of the present technology for purposes of illustration only, wherein the figures use like reference numerals to identify like elements. One skilled in the art will readily recognize from the following discussion that alternative embodiments of the structures and methods illustrated in the figures can be employed without departing from the principles of the present technology described herein.

DETAILED DESCRIPTION

Coaxial cables can support communications in a variety of contexts. One such context is communications that involve the home. For example, cable television (CaTV) is a system that delivers content programming to consumers at their residences via radio frequency (RF) signals transmitted through coaxial cables. As another example, Multimedia over Coax Alliance (MoCA) is a standards consortium that provides specifications for networking over coaxial cable in residences.

In cable television, at a headend associated with a cable company, television channels are assigned to different frequency slots to avoid interference. The television channels are communicated through multiplexing over a cable distribution line that can be supported on utility poles or positioned underground. A coaxial cable can carry the television channels from the cable distribution line to a residence (or other type of building) of a customer or subscriber through a service drop, which can be in the form of an overhead or underground cable. The service drop can terminate at a cable box on the exterior of the residence. A coaxial cable coupled to the cable box can enter the residence. Multiple coaxial cables can be split off the incoming cable and connected to outlets in different rooms of the residence. For a television coupled to an outlet, a set-top box provided by the cable company can translate a desired channel back to its original baseband frequency for display on the television.

A customer may wish to enjoy cable television services at home. In a conventional technique, upon receipt of a request for cable television services by the customer, a cable company may dispatch a technician to the residence of the customer. While at the residence, the technician may need to install necessary equipment, such as a cable modem. During the visit, the technician can use test equipment to observe signals received at an outlet of the residence to which the cable modem and a television are to be coupled for cable television service. The power level of the signals received at the outlet must be adequate for the proper delivery of cable television service. Thus, confirmation that the power level of the signals received at the outlet is satisfactory should precede installation of the cable modem. If the power level of the signals is insufficient, the technician or other personnel will need to troubleshoot to try to identify and resolve the technical problems responsible for the poor power level. In many instances, no such problems exist and installation of the cable modem can proceed expeditiously in a straightforward manner to establish cable television service. In either case, each visit by a technician incurs significant costs for the cable company and for the customer as well in terms of inconvenience and lost time.

An improved approach rooted in communications and electronics technologies overcomes the foregoing and other disadvantages associated with conventional approaches specifically arising in the realm of communications and electronics technologies. Based on communications and electronics technologies, the present technology in various embodiments provides a radio frequency (RF) outlet power test device. The device can include an F-connector to connect to an outlet in a building (e.g., residence). The device can split an RF signal received at the outlet into multiple frequency bands. For example, a first frequency band may be associated with a first type of network communications (e.g., CaTV) and a second frequency band may be associated with a second type of network communications (e.g., MoCA). A power detector (or RF power detector), such as a log amp (logarithmic amplifier), for each frequency band can convert RF power of the frequency band to a measurable DC voltage. For example, a first log amp for the first frequency band can convert RF power of the first frequency band into a first DC voltage. Likewise, a second log amp for the second frequency band can convert RF power of the second frequency band into a second DC voltage. A processor, such as an ARM processor, can digitize the DC voltage provided by each log amp. The processor can compare each DC voltage with an associated pass/fail threshold. If the DC voltage associated with a frequency band satisfies the threshold, the device can provide an indication to a user of the device that the power level of the frequency band at the outlet is adequate. If the DC voltage associated with the frequency band does not satisfy the threshold, the device can provide an indication that the power level of the frequency band at the outlet is not adequate, informing that further installation of network equipment should be suspended in favor of troubleshooting the network.

Operation of the device in accordance with the present technology is simple. In this regard, the device, through its F-connector, can be manually pushed onto an outlet to test the RF power level at the outlet. In one example implementation, a button can be pushed to initiate operation of the device. Thereafter, no other manual action or effort in relation to testing of the outlet by the device is needed. The device automatically can provide a first indication when the power level of a particular frequency band at the outlet is sufficient and a second indication when the power level of the frequency band at the outlet is insufficient. For example, the first indication can be a green light and the second indication can be a red light. Similar indications can be provided for power levels of other frequency bands. The indications can inform whether the outlet can be properly used for various types of network communications.

The simplicity and versatility of the device in accordance with the present technology can allow a cable company to forego dispatch of technicians to residences to establish cable services. Rather, a cable company can provide directly to a customer a package of equipment needed to establish cable service. The package can include the device in accordance with the present technology along with other equipment, such as a cable modem. The package also can contain instructions, or access thereto, about how to use the equipment. In this regard, the customer may be prompted to connect the device to outlets of a residence that can be used for cable television. After connection to an outlet and a command by the customer to the device to initiate testing, the device automatically determines whether the power levels at the outlet are adequate and provides related indications about the power levels to the customer. When the device indicates adequate power levels, the customer can take further action (e.g., installation of cable modem) as needed to enable cable television services. When the device indicates inadequate power levels, the customer can contact the cable company for further technical assistance and a possible visit by a technician. Operation of the device by the customer herself to test an outlet can obviate the need to dispatch a technician for the same purpose. The device thus poses significant advantages to a cable company in terms of cost savings and personnel management as well as to the customer in terms of convenience.

The present technology is advantageous in many other respects. For example, the present technology provides a determination about a power level for a selected frequency band by accounting for all channels in the selected frequency band. The present technology thus avoids inaccurate or incomplete assessments about a frequency band based on power level determinations premised on a sampling of a small number of channels in the frequency band. In addition, unlike conventional devices that are limited in bandwidth, the present technology can determine power levels for signals associated with high frequencies (e.g., over 1 GHZ). As another example, the present technology allows a single device to determine the adequacy of power levels for a multitude of frequency bands associated with various types of network communications that are each associated with their own thresholds. Accordingly, the present technology is more versatile and effective than equipment capable of evaluating only one frequency band or only one type of network communications. Moreover, the modest cost of the device in accordance with the present technology reduces the expense of cable company operations and thus moderates costs ultimately passed on to customers. These and other inventive features of the various embodiments of the present technology are discussed in more detail below.

FIG. 1 illustrates an example device 100, according to various embodiments associated with an example configuration of the present technology. In some embodiments, the device 100 can be test equipment to determine signal characteristics appearing at an outlet supporting network communications. The device 100 can include a connector 102, a diplexer 104 having a first filter 106 and a second filter 108, a first log amp (logarithmic amplifier) 110, a second log amp 112, a processor 114, indicators 116-122, a power supply 130, a memory 132, and a switch 134. The components (e.g., modules, elements, interfaces, blocks, functions, switches, etc.) of the device 100 shown in this figure and all figures herein are exemplary only, and other implementations may include additional, fewer, integrated, or different components. For example, the first log amp 110 or the second log amp 112 can be or include a detector log video amplifier (DLVA), successive detection log video amplifiers (SDLVA), true log amplifier (TLA), or the like. Further, although the first log amp 110 and the second log amp 112 are shown in FIG. 1 as examples, the device 100 in other embodiments instead can include any type of power detector (or RF power detector) capable of deriving a DC voltage from an RF signal. In some embodiments, instead of or in addition to the first log amp 110 or the second log amp 112, the device 100 can include any suitable number or combination of the following: envelope detector, peak detector, vector power detector, RMS detector, thermal detector, square law detector, diode detector, or the like. Many variations are possible. Some components may not be shown so as not to obscure relevant details. Some components may be simplified so as to allow focus on relevant details. The device 100 and the devices illustrated in the other figures herein can constitute test equipment that are special purpose computers. In some embodiments, the components of the device 100 are integrated into a single (or one) device or apparatus. In other embodiments, the components of the device 100 can be distributed over two or more devices or apparatuses.

The device 100 can be coupled (or connected) to an outlet of a building through the connector 102. The outlet can be an outlet of a plurality of outlets associated with a building. The plurality of outlets can provide signals supporting network communications that are carried over communications media in, through, or near the building. For example, the communications media can include coaxial cabling of a building that carries signals to various locations of the building through outlets positioned in the various locations. The signals at each outlet can be associated with various frequency bands associated with various types of network communications. For example, signals at an outlet can be associated with different RF frequency bands corresponding to different types of network communications (e.g., CaTV, MoCA, etc.). In some embodiments, the connector 102 can be an F-type connector (e.g., male, female) that is configured to mate with or be pushed onto an outlet configured to receive the F-type connector (e.g., female, male). In other embodiments, other types of connectors can be used.

A signal at the outlet is carried from the connector 102 to the diplexer 104. The diplexer 104 can be a discrete diplexer. The diplexer 104 can be configured to selectively pass predetermined frequency bands associated with different types of network communications. In some embodiments, the first filter 106 of the diplexer 104 can be a band pass filter configured to pass a first frequency band and filter out frequencies outside of the first frequency band. Likewise, in some embodiments, the second filter 108 of the diplexer 104 can be a band pass filter configured to pass a second frequency band and filter out frequencies outside of the second frequency band. In other embodiments, the first filter 106 and the second filter 108 can be band pass filters, high pass filters, low pass filters, or any combination thereof.

The first filter 106 can be configured to pass a selected first frequency band associated with a first type of network communications, such as CaTV. In some embodiments, the first frequency band passed by the first filter 106 can be a portion or subset of the spectrum of channels associated with CaTV. In one example implementation, the first frequency band passed by the first filter 106 is approximately 55 MHz-823 MHz (768 MHz bandwidth) and includes approximately 128 digital channels with each channel occupying approximately 6 MHz. In another example implementation, if the spectrum of channels associated with CaTV expands to include additional frequencies (e.g., expands to 1218 MHz or some other upper or lower bound), the first frequency band passed by the first filter 106 can remain unchanged based on such expansion or can change based on such expansion. Many variations are possible. In other embodiments, the first frequency band passed by the first filter 106 can be the entirety of the spectrum of channels associated with CaTV.

The portion or subset of the spectrum of channels associated with CaTV that constitute the first frequency band can be determined by, for example, a manufacturer of the device 100. The determination of the first frequency band passed by the first filter 106 can be based on one or a combination of various considerations. For example, the first frequency band can be selected to be appropriately wide by, for example, satisfying a predetermined frequency band threshold value. As another example, the first frequency band can be determined to include a predetermined number of channels that in satisfactory operating conditions would have a total power level satisfying one or more predetermined thresholds or conditions relating to power level. The total power level can be determined based on an aggregation of power levels of each channel in the first frequency band in satisfactory operating conditions. As yet another example, the number of channels included in the first frequency band can be determined so that a total power level of the channels as detected by the first log amp 110 falls within the linear (or accurate) range of the log amp 110. As yet still another example, the first frequency band can be determined to be a frequency band that is in common use across different cable companies. For example, the lower bound and the upper bound of the first frequency band can be determined so that the first frequency band covers CaTV channels across a threshold number of different cable companies. Such a determination of the first frequency band allows the device 100 to have broader application to a large base of customers of cable companies across a multitude of geographic regions.

The second filter 108 can be configured to pass a selected second frequency band associated with a second type of network communications, such as MoCA. In some embodiments, the second frequency band passed by the second filter 108 can be the entirety (or a subset) of the spectrum of channels associated with MoCA. In one example implementation, the second frequency band passed by the second filter 108 is approximately 1125 MHz-1625 MHz (Band D Extended). In another example implementation, if the spectrum of channels associated with CaTV expands to include additional frequencies (e.g., expands to 1218 MHz or some other upper or lower bound), an attendant shift in a MoCA beacon may be warranted to avoid overlap. In such a case, the second frequency band passed by the second filter 108 can change to increase the lower bound of the second frequency band. In one example implementation where the spectrum of channels associated with CaTV expands to 1218 MHz, the second frequency band passed by the second filter 108 can be 1325 MHz-1625 MHz. Many variations are possible in other implementations.

The first frequency band passed by the first filter 106 can be provided to the first log amp 110. The second frequency band passed by the second filter 108 can be provided to the second log amp 112. The first log amp 110 functions to convert RF power provided to the first log amp 110 into a first DC voltage. The second log amp 112 likewise functions to convert RF power provided to the second log amp 112 into a second DC voltage. A relatively higher RF power provided to the first log amp 110 or the second log amp 112 results in relatively higher DC voltage output by, respectively, the first log amp 110 or the second log amp 112. When the total power level of the first frequency band or the second frequency band is relatively high or satisfies a threshold value, a relatively inexpensive log amp can be selected as the first log amp 110 and the second log amp 112, thus reducing overall cost of the device 100.

The first log amp 110 can output the first DC voltage to the processor 114. Likewise, the second log amp 112 can output the second DC voltage to the processor 114. In some embodiments, the processor 114 can be an ARM-type processor. The functionality of the processor 114 as described herein allows for selection of an inexpensive processor, thus further reducing overall cost of the device 100.

ADC (analog-to-digital converter) inputs on the processor 114 can digitize the first DC voltage and compare the first DC voltage with a first threshold value. The first threshold value can be based on a minimum acceptable power level of signals associated with the first type of network communications (e.g., CaTV). For example, the first threshold value can represent or be based on a minimum value that the total power level of the first frequency band should equal or exceed to confirm the existence of satisfactory operating conditions at the outlet to which the connector 102 is coupled. In an example implementation where the first threshold value is associated with CaTV, the first threshold value can be based on a minimum power level for each channel in the first frequency band. The minimum power level for each channel can be determined by, for example, a cable company. Based on the minimum power level for each channel, a subset of the spectrum for CaTV can be selected as the first frequency band so that the total power of the first frequency band under satisfactory operating conditions at the outlet falls within the linear range of the first log amp 110, as discussed herein. In addition, selection of the subset of the spectrum for CaTV as the first frequency band can be based on other considerations, such as ease of calculating the total power of the first frequency band. In some embodiments, the first threshold value is (or can be based on) the DC voltage value output by the first log amp 110 in response to provision of the first frequency band to the first log amp 110 when the total power level of the first frequency band is at a minimum (or lowest) level needed for satisfactory operating conditions associated with the first type of network communications.

In one example implementation, a minimum power level for each channel in the first frequency band can be −10 dBmV. In this example implementation, the first frequency band can be selected as 55 MHz-823 MHz. This first frequency band can have 128 digital channels with each channel being 6 MHz. Accordingly, based on the minimum power level for each channel of −10 dbmV and the number of channels in the first frequency band, the total power level of the first frequency band under satisfactory operating conditions can be at least +11 dBmV. Thus, total power level of the first frequency band measured by the device 100 must be greater than or equal to +11 dBmV. Accordingly, the first threshold value in this example implementation can be the DC voltage output by the first log amp 110 when +11 dBmV is applied to the first log amp 110. Many other variations are possible.

Similarly, the processor 114 can digitize the second DC voltage and compare the second DC voltage with a second threshold value. When the second type of network communications is MoCA, the processor 114 can apply peak detection of the beacon or average detection of the beacon. The second threshold value can be based on a minimum acceptable power level of signals associated with the second type of network communications (e.g., MoCA). For example, the second threshold value can represent a minimum value that the total power level of the second frequency band should equal or exceed to confirm the existence of satisfactory operating conditions at the outlet to which the connector 102 is coupled. In an example implementation where the second threshold value is associated with MoCA, the second threshold value can be based on a minimum power level of a beacon in the second frequency band. The minimum power level of the beacon can be determined by, for example, a relevant standard associated with MoCA or a manufacturer of network equipment that supports MoCA. As discussed, the entirety of the spectrum for MoCA can be selected as the second frequency band so that the beacon at any frequency in the second frequency band can be accounted for and the power level of the beacon can be determined. The second threshold value can be based on the total power level of the second frequency band under minimum satisfactory operating conditions. In some embodiments, the second threshold value is (or can be based on) the DC voltage value output by the second log amp 112 in response to provision of the second frequency band to the second log amp 112 when the total power level of the second frequency band is at a minimum (or lowest) level needed for satisfactory operating conditions associated with the second type of network communications.

In one example implementation, a minimum power level for the beacon can be +50 dBmV. In this example implementation, the second frequency band can be selected as 1125 MHz-1625 MHz (Band D Extended). Where the outlet appears in a residence having a "home run" coaxial wiring configuration and a maximum splitter port-to-port isolation is less than or equal to 40 dB, the total power level of the second frequency band under minimum satisfactory operating conditions can be +10 dBmV. Thus, total power level of the second frequency band measured by the device 100 must be greater than or equal to +10 dBmV. Accordingly, the second threshold value in this example implementation can be the DC voltage output by the second log amp 112 when +10 dBmV is applied to the second log amp 112. In other implementations, different variations are possible.

The first threshold value and the second threshold value can be digitized by the processor 114 and stored in the memory 132. The first threshold value and the second threshold value can be different values. The first threshold value and the second threshold value are accessible to the processor 114 during testing of outlets by the device 100. The first threshold value and the second threshold value are configurable or programmable, and can be changed based on guidance or requirements from, for example, a cable company, manufacturers of equipment for associated types of network communications, and a manufacturer of the device 100.

The processor 114 can be coupled to indicators 116-122. The indicators 116-122 can be visible through a case or housing of the device 100. In some embodiments, the indicators 116-112 can be light emitting diodes that emit different colors of light. For example, the indicator 116 can be an LED that emits green light; the indicator 118 can be an LED that emits red light; the indicator 120 can be an LED that emits green light; and, the indicator 122 can be an LED that emits red light. In an example implementation, when the first DC voltage satisfies the first threshold value, the processor 114 can turn on the indicator 116 to indicate that the power level at the outlet is likely adequate for the first type of network communications (e.g., CaTV). The emitted green light conveys PASS to a user of the device 100. In the example implementation, when the first DC voltage does not satisfy the first threshold value, the processor 114 can turn on the indicator 118 to indicate that the power level at the outlet is likely not adequate for the first type of network communication. The emitted red light conveys FAIL to the user of the device 100. Activation of the indicator 118 can prompt the user of the device 100 to suspend installation activities for the first type of network communications and troubleshoot the network instead. Similarly, when the second DC voltage satisfies the second threshold value, the processor 114 can turn on the indicator 120 to indicate that the power level at the outlet is likely adequate for the second type of network communications (e.g., MoCA). The emitted green light conveys PASS to the user of the device 100. In the example implementation, when the second DC voltage does not satisfy the second threshold value, the processor 114 can turn on the indicator 122 to indicate that the power level at the outlet is likely not adequate for the second type of network communication. The emitted red light conveys FAIL to the user of the device 100. Activation of the indicator 122 can prompt the user of the device 100 to suspend installation of equipment for the second type of network communications and troubleshoot the network instead. In some embodiments, a different number of indicators can be used to convey test results for various types of network communications. In some embodiments, indication of the likely sufficiency or insufficiency of the power level at the outlet for different types of network communications can be implemented in various manners through other mechanisms without use of the indicators 116-122.

The power supply 130 can provide built-in power for operation of the device 100. In particular, the power supply 130, through the switch 134, can provide power to the first log amp 110, the second log amp 112, and the processor 114. In some embodiments, the switch 134 can be implemented with or activated by a momentary button that is depressible by a user of the device 100. The momentary button can be accessible through an opening of a case or housing of the device 100. Upon depression of the momentary button, the device 100 can be powered on and proceed to test the power level at an outlet to which the device 100 is connected and to indicate test results relating to the likely sufficiency or insufficiency of the power level to the user of the device 100. After the device 100 is manually connected to an outlet using the connector 102, a single depression of the button that turns on the switch 134 is sufficient to initiate, perform, and complete a test of the outlet and to indicate results of the test. A single depression of the button by the user of the device 100 can cause the outlet to be tested and the test results to be indicated without the need for further inputs, commands, or other manual action by the user. In an example implementation, each instance of a test and indication of test results can be completed in less than 15 seconds. In an example implementation, the power supply

130 can be a 3 volt cell, which can provide power for tests at over 50 outlets. Many variations are possible.

CaTV and MoCA are discussed herein as examples of types of network communications that can be tested by the device 100 at various outlets. In other embodiments, the device 100 can be configured to test other types of network communications apart from CaTV and MoCA. In these embodiments, the design and operation of the device 100 as set forth herein can be appropriately modified or adapted to be suitably configured for and compatible with testing of the other types of network communications.

Figure 2:
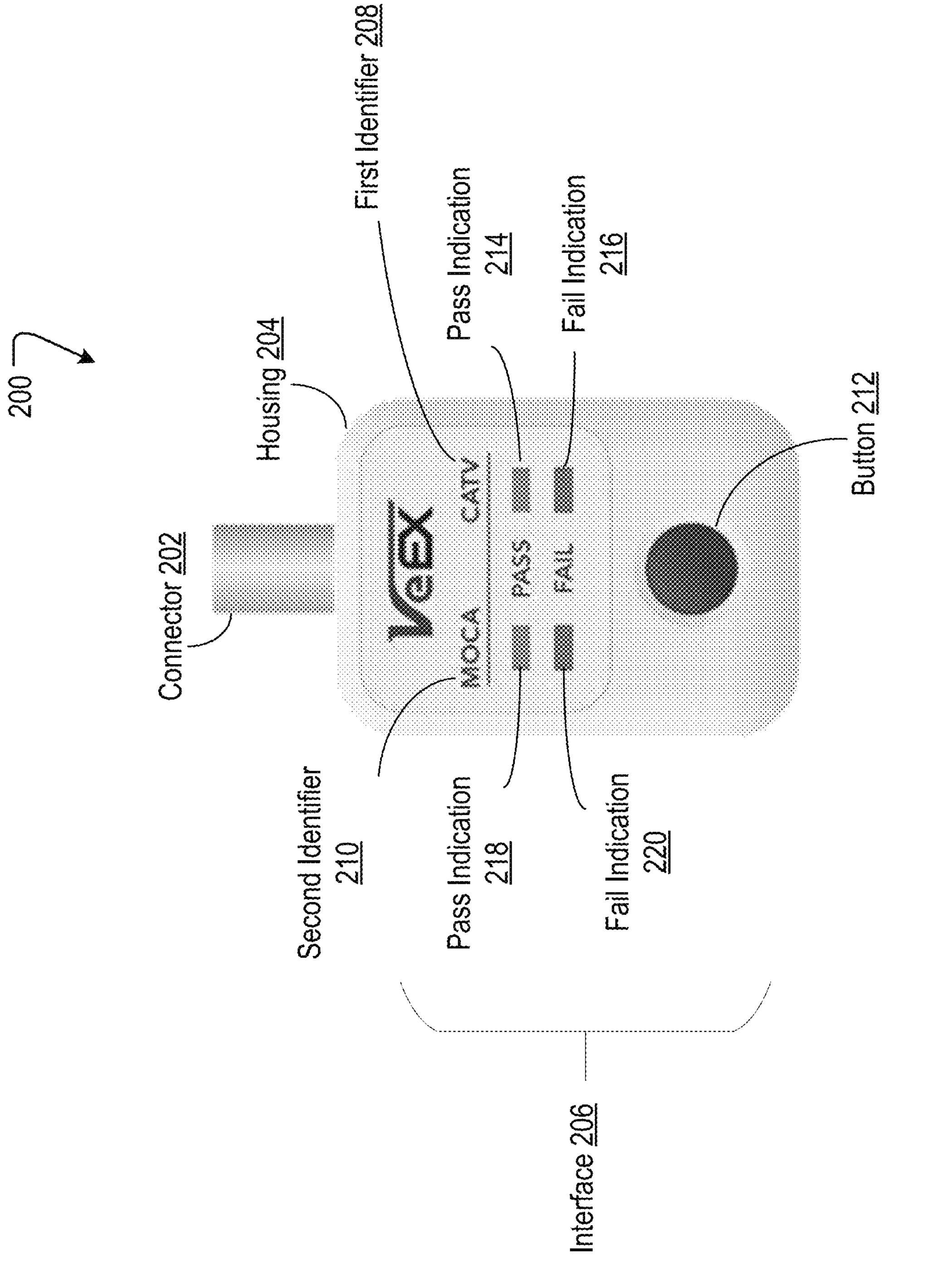
FIG. 2 illustrates a housing of a device in a second example configuration, according to various embodiments of the present technology.

FIG. 2 illustrates an example device 200, according to various embodiments associated with an example configuration of the present technology. In some embodiments, the device 200 can be an implementation of the device 100. The device 200 includes a connector 202 and a housing 204. The connector 202, which is been described in more detail in connection with the connector 102 in FIG. 1, can be an F-type connector (e.g., male, female) that is configured to mate with or be pushed onto an outlet (e.g., female, male) configured to receive the F-type connector. The housing 204 encases components of the device 200 described in connection with FIG. 1.

The housing 204 includes an interface 206. The interface 206 enables interaction and communication between a user of the device 200 and the device 200. The interface 206 includes a first identifier 208 that references a first type of network communications that the device 200 can test. As shown, the first identifier 208 identifies CaTV as the first type of network communications that can be tested by the device 200. The interface 206 includes a second identifier 210 that references a second type of network communications that the device 200 can test. As shown, the second identifier 210 identifies MoCA as the second type of network communications that can be tested by the device 200. In other implementations, the device 200 can be configured to test other types of network communications apart from CaTV and MoCA and accordingly the interface 206 can be modified to reflect references to the other types of network communications.

The interface 206 includes a button 212. The button 212 can be a momentary button. When depressed, the button 212 can cause delivery of power as needed to components of the device 200 for operation of the device 200. As described in more detail herein, the device 200 can test the sufficiency of power levels of signals associated with various types of network communications at an outlet to which the device 200 is connected. When the device 200 determines that the power level of signals associated with CaTV are sufficient for network communications, a pass indication 214 can be activated to indicate that conditions at the outlet have passed the test. For example, the pass indication 214 can be green light emitted by an LED. When the device 200 determines that the power level of signals associated with CaTV are not sufficient, a fail indication 216 can be activated to indicate that conditions at the outlet have not passed the test. For example, the fail indication 216 can be red light emitted by an LED. Similarly, when the device 200 determines that the power level of signals associated with MoCA are sufficient for network communications, a pass indication 218 can be activated to indicate that conditions at the outlet have passed the test. For example, the pass indication 218 can be green light emitted by an LED. When the device 200 determines that the power level of signals associated with MoCA are not sufficient, a fail indication 220 can be activated to indicate that conditions at the outlet have not passed the test. For example, the fail indication 220 can be red light emitted by an LED. The device 200 thus allows a user of the device 200 to quickly and easily perform tests and receive test results.

Figure 3A:
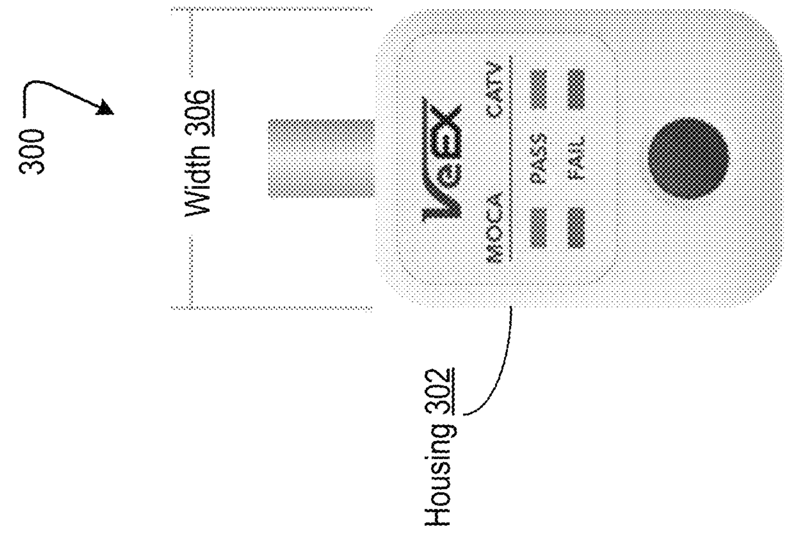
FIGS. 3A-3B illustrate dimensions of a device in a third example configuration, according to various embodiments of the present technology.
Figure 3B:
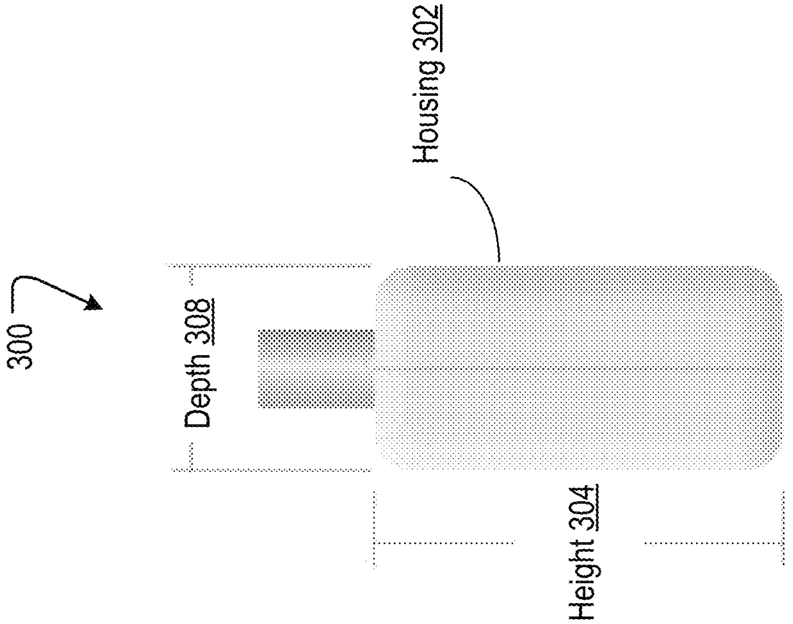

FIGS. 3A and 3B illustrate an example device 300, according to various embodiments associated with an example configuration of the present technology. In some embodiments, the device 300 can be an implementation of the device 100. In some embodiments, the device 300 can be the device 200. The device 300 can have a small, portable form factor to optimize its ease of use. For example, the device 300 can be dimensioned to allow one-handed testing by a user of the device 300. In addition, the small, compact size of the device 300 can allow the device 300 to be conveniently grasped, maneuvered, connected, and operated at any outlet location, including outlet locations in cramped quarters, such as behind furniture or in areas crowded with obstacles. In one example implementation, a housing 302 of the device 300 can have a height 304 of approximately 52 mm, a width 306 of approximately 38 mm, and a depth 308 of approximately 26 mm. In another example implementation, a housing 302 of the device 300 can have a height 304 of approximately 2 inches, a width 306 of approximately 1.5 inches, and a depth 308 of approximately 1 inch. Many other dimensions and configurations in other implementations are possible.

Figure 4:
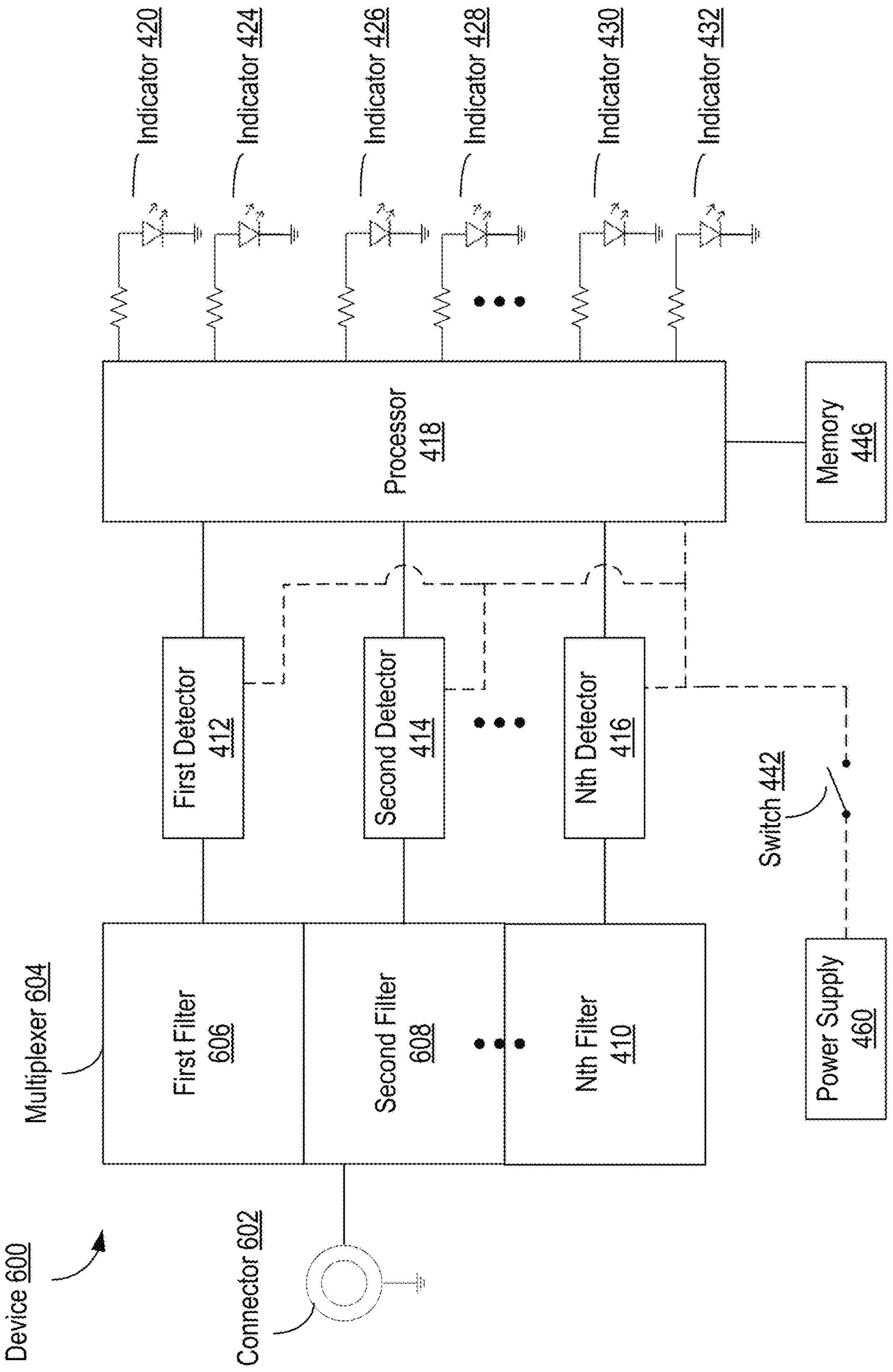
FIG. 4 illustrates a device in a fourth example configuration, according to various embodiments of the present technology.

FIG. 4 illustrates an example device 400, according to various embodiments associated with an example configuration of the present technology. In contrast to the device 100, the device 400 can test any number (e.g., more than two) of bands associated with various types of network communications. The device 400 can include a connector 402; a multiplexer 404 having a first filter 406, a second filter 408, and an nth filter 410; a first detector 412; a second detector 414; an nth detector 416; a processor 418; indicators 420-432; a power supply 440; a switch 442; and a memory 446. The multiplexer 404 can be a diplexer, a triplexer, quadruplexer, or other type of multiplexer that can separate signals at an outlet to which the device 400 is connected into any number of n bands. The multiplexer 404 can use any combination of high pass, band pass, and low pass filters to separate signals at the outlet into n bands. Each of the n bands can be associated with a type of network communications. While CaTV and MoCA are discussed herein as examples of types of network communications, the present technology can apply to additional or alternative types of network communications now existing or later arising. The first filter 406 can be configured to pass a selected first frequency band associated with a first type of network communications. The first frequency band passed by the first filter 406 can be a portion (or subset) or entirety of the spectrum of channels associated with the first type of network communications. The first detector 412 can be an RF power detector that samples RF signals and outputs a proportional DC voltage. In some embodiments, the first detector 412 can be or include a log amp. In some embodiments, the first detector 412 can be or include a device other than a log amp, as set forth herein. The DC voltage output by the first detector 412 can be provided to the processor 418. The processor 418 can digitize the DC voltage and compare the DC voltage with a predetermined first threshold value associated with the first type of network communications. The first threshold value can represent a minimum value of a power level of the first frequency band under satisfactory operating conditions associated with the first type of network communications. If the DC voltage satisfies the first threshold value, the power level of the first frequency band is deemed to pass the test, and the processor 418 can activate the indicator 420 to indicate test passage to a user of the device 400. Upon an indication of test passage, further set up or installation of equipment to support network communications can proceed. If the DC voltage does not satisfy the first threshold value, the power level of the first frequency band is deemed to fail the test, and the processor 418 can activate the indicator 424 to indicate test failure to the user of the device 400. Upon the indication of test failure, the user of the device 400 can take further action to troubleshoot the network. In some embodiments, the design and operation of the second filter 408, the second detector 414, the nth filter 410, and the nth detector 416 can be similar to the design and operation of the first filter 406 and the first detector 412. In some embodiments, the design and operation of the first filter 406, the first detector 412, the second filter 408, the second detector 414, the nth filter 410, and the nth detector 416 can be similar to the design and operation of the first filter 106, the first log amp 110, the second filter 108, and the second log amp 112 in FIG. 1. Subject to the foregoing discussion, the function and operation of the components of the device 400 otherwise can be substantially the same as the function and operation of the same (or commonly named) or equivalent components of the device 100 in FIG. 1, as discussed herein.

Figure 5:
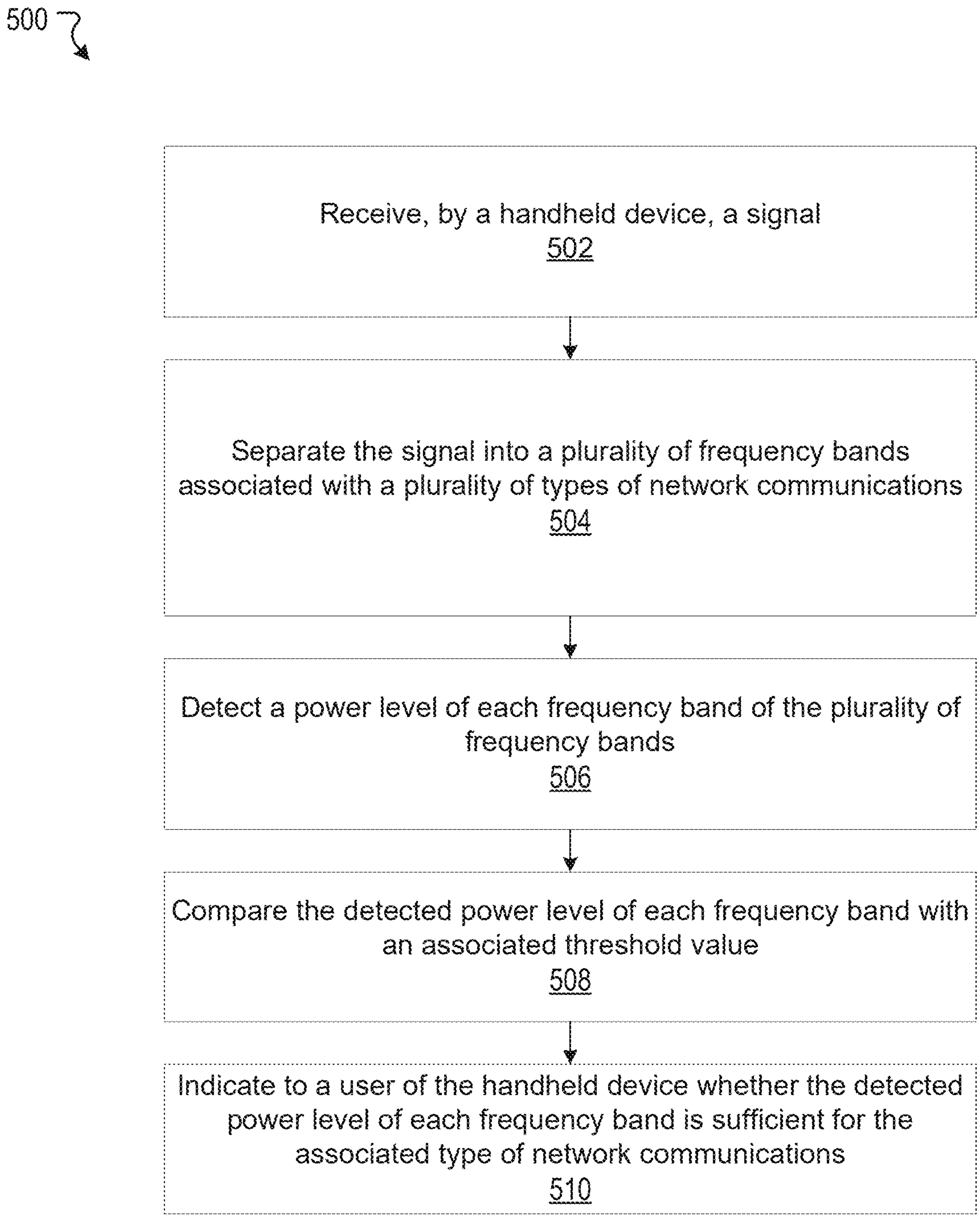
FIG. 5 illustrates an example method, according to various embodiments of the present technology.

FIG. 5 illustrates an example method 500, according to various embodiments of the present technology. It should be appreciated that there can be additional, fewer, or alternative steps performed in similar or alternative orders, or in parallel, within the scope of the various embodiments discussed herein unless otherwise stated.

At 502, the example method 500 can receive, by a handheld device, a signal. At 504, the example method 500 can separate the signal into a plurality of frequency bands associated with a plurality of types of network communications. At 506, the example method 500 can detect a power level of each frequency band of the plurality of frequency bands. At 508, the example method 500 can compare the detected power level of each frequency band with an associated threshold value. At 510, the example method 500 can indicate to a user of the handheld device whether the detected power level of each frequency band is sufficient for the associated type of network communications.

It is contemplated that there can be many other uses, applications, and/or variations associated with the various embodiments of the present technology.

Figure 6:
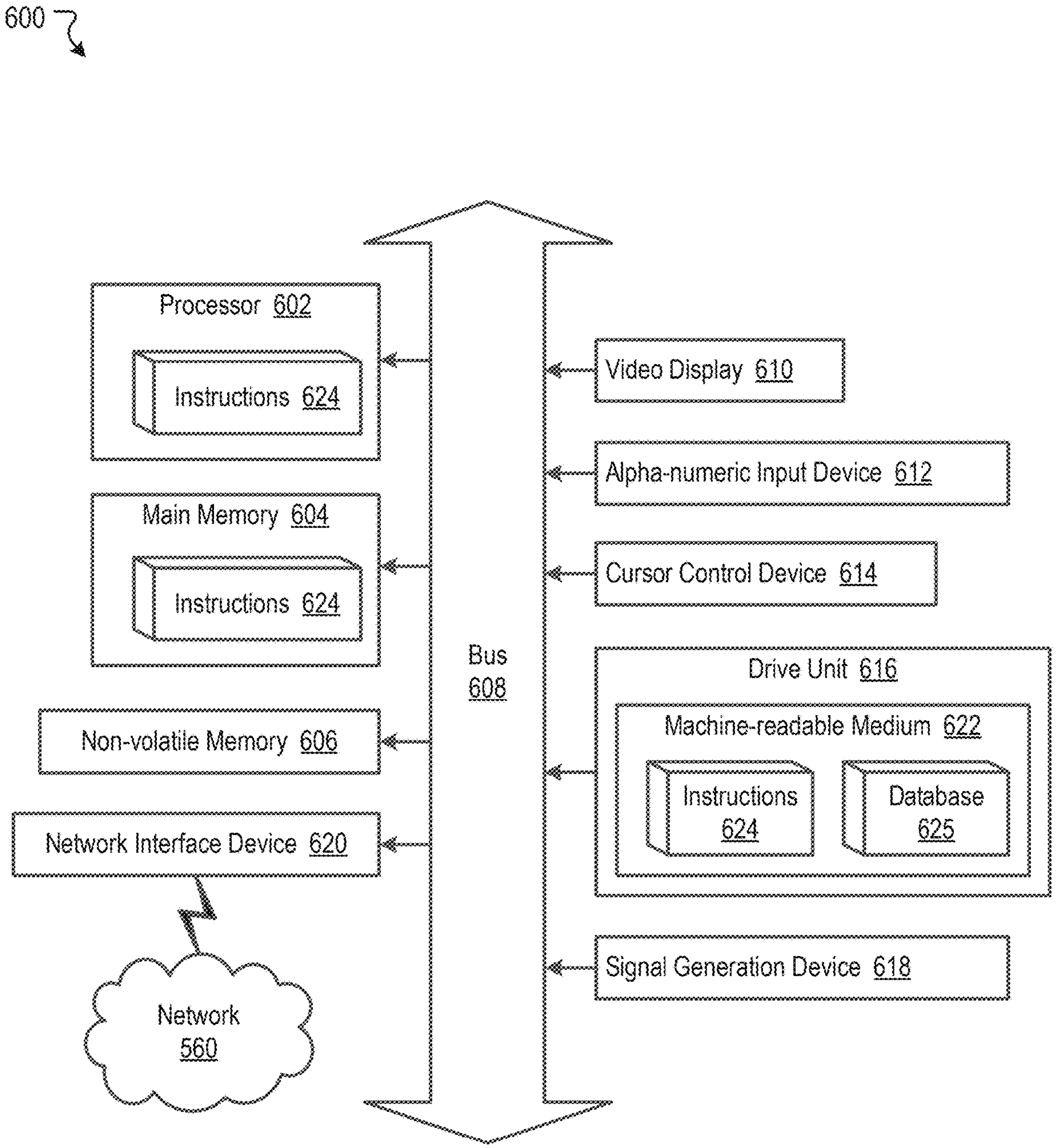
FIG. 6 illustrates an example of a computing system to implement one or more embodiments described herein, according to various embodiments of the present technology.

The foregoing processes and features can be implemented by a wide variety of machine and computing system architectures and in a wide variety of network and computing environments. FIG. 6 illustrates an example of a computing system (or computing device) 600 that may be used to implement one or more of the embodiments described herein according to various embodiments of the present technology. The computing system 600 includes sets of instructions 624 for causing the computing system 600 to perform the processes and features discussed herein. The computing system 600 may be connected (e.g., networked) to other machines and/or computer systems. In a networked deployment, the computing system 600 may operate in the capacity of a server or a client machine in a client-server network environment, or as a peer machine in a peer-to-peer (or distributed) network environment.

The computing system 600 includes a processor 602 (e.g., a central processing unit (CPU), a graphics processing unit (GPU), or both), a main memory 604, and a nonvolatile memory 606 (e.g., volatile RAM and non-volatile RAM, respectively), which communicate with each other via a bus 608. In some embodiments, the computing system 600 can be a desktop computer, a laptop computer, personal digital assistant (PDA), or mobile phone, for example. In one embodiment, the computing system 600 also includes a video display 610, an alphanumeric input device 612 (e.g., a keyboard), a cursor control device 614 (e.g., a mouse), a drive unit 616, a signal generation device 618 (e.g., a speaker) and a network interface device 620.

In one embodiment, the video display 610 includes a touch sensitive screen for user input. In one embodiment, the touch sensitive screen is used instead of a keyboard and mouse. The disk drive unit 616 includes a machine-readable medium 622 on which is stored one or more sets of instructions 624 (e.g., software) embodying any one or more of the methodologies or functions described herein. The instructions 624 can also reside, completely or at least partially, within the main memory 604 and/or within the processor 602 during execution thereof by the computing system 600. The instructions 624 can further be transmitted or received over a network 540 via the network interface device 620. In some embodiments, the machine-readable medium 622 also includes a database 625.

Volatile RAM may be implemented as dynamic RAM (DRAM), which requires power continually in order to refresh or maintain the data in the memory. Non-volatile memory is typically a magnetic hard drive, a magnetic optical drive, an optical drive (e.g., a DVD RAM), or other type of memory system that maintains data even after power is removed from the system. The non-volatile memory 606 may also be a random access memory. The non-volatile memory 606 can be a local device coupled directly to the rest of the components in the computing system 600. A non-volatile memory that is remote from the system, such as a network storage device coupled to any of the computer systems described herein through a network interface such as a modem or Ethernet interface, can also be used.

While the machine-readable medium 622 is shown in an exemplary embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present technology. Examples of machine-readable media (or computer-readable media) include, but are not limited to, recordable type media such as volatile and non-volatile memory devices; solid state memories; floppy and other removable disks; hard disk drives; magnetic media; optical disks (e.g., Compact Disk Read-Only Memory (CD ROMS), Digital Versatile Disks (DVDs)); other similar non-transitory (or transitory), tangible (or non-tangible) storage medium; or any type of medium suitable for storing, encoding, or carrying a series of instructions for execution by the computing system 600 to perform any one or more of the processes and features described herein.

In general, routines executed to implement the embodiments of the invention can be implemented as part of an operating system or a specific application, component, program, object, module or sequence of instructions referred to as "programs" or "applications." For example, one or more programs or applications can be used to execute any or all of the functionality, techniques, and processes described herein. The programs or applications typically comprise one or more instructions set at various times in various memory and storage devices in the machine and that, when read and executed by one or more processors, cause the computing system 600 to perform operations to execute elements involving the various aspects of the embodiments described herein.

The executable routines and data may be stored in various places, including, for example, ROM, volatile RAM, non-volatile memory, and/or cache memory. Portions of these routines and/or data may be stored in any one of these storage devices. Further, the routines and data can be obtained from centralized servers or peer-to-peer networks. Different portions of the routines and data can be obtained from different centralized servers and/or peer-to-peer networks at different times and in different communication sessions, or in a same communication session. The routines and data can be obtained in entirety prior to the execution of the applications. Alternatively, portions of the routines and data can be obtained dynamically, just in time, when needed for execution. Thus, it is not required that the routines and data be on a machine-readable medium in entirety at a particular instance of time.

While embodiments have been described fully in the context of computing systems, those skilled in the art will appreciate that the various embodiments are capable of being distributed as a program product in a variety of forms, and that the embodiments described herein apply equally regardless of the particular type of machine- or computer-readable media used to actually effect the distribution.

Alternatively, or in combination, the embodiments described herein can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

For purposes of explanation, numerous specific details are set forth in order to provide a thorough understanding of the description. It will be apparent, however, to one skilled in the art that embodiments of the technology can be practiced without these specific details. In some instances, modules, structures, processes, features, and devices are shown in block diagram form in order to avoid obscuring the description discussed herein. In other instances, functional block diagrams and flow diagrams are shown to represent data and logic flows. The components of block diagrams and flow diagrams (e.g., modules, engines, blocks, structures, devices, features, etc.) may be variously combined, separated, removed, reordered, and replaced in a manner other than as expressly described and depicted herein.

Reference in this specification to "one embodiment," "an embodiment," "other embodiments," "another embodiment," "in various embodiments," or the like means that a particular feature, design, structure, or characteristic described in connection with the embodiment is included in at least one embodiment of the technology. The appearances of, for example, the phrases "according to an embodiment," "in one embodiment," "in an embodiment," "in various embodiments," or "in another embodiment" in various places in the specification are not necessarily all referring to the same embodiment, nor are separate or alternative embodiments mutually exclusive of other embodiments. Moreover, whether or not there is express reference to an "embodiment" or the like, various features are described, which may be variously combined and included in some embodiments but also variously omitted in other embodiments. Similarly, various features are described which may be preferences or requirements for some embodiments but not other embodiments.

Although embodiments have been described with reference to specific exemplary embodiments, it will be evident that the various modifications and changes can be made to these embodiments. Accordingly, the specification and drawings are to be regarded in an illustrative sense rather than in a restrictive sense. The foregoing specification provides a description with reference to specific exemplary embodiments. It will be evident that various modifications can be made thereto without departing from the broader spirit and scope as set forth in the following claims. The specification and drawings are, accordingly, to be regarded in an illustrative sense rather than a limiting or restrictive sense.

Although some of the drawings illustrate a number of operations or method steps in a particular order, steps that are not order dependent may be reordered and other steps may be combined or omitted. While some reordering or other groupings are specifically mentioned, others will be apparent to those of ordinary skill in the art and so do not present an exhaustive list of alternatives. Moreover, it should be recognized that the stages could be implemented in hardware, firmware, software, or any combination thereof.

It should also be understood that a variety of changes may be made without departing from the essence of the invention. Such changes are also implicitly included in the description. They still fall within the scope of this invention. It should be understood that this technology is intended to yield a patent covering numerous aspects of the invention, both independently and as an overall system, and in both method and apparatus modes.

Further, each of the various elements of the invention and claims may also be achieved in a variety of manners. This technology should be understood to encompass each such variation, be it a variation of an embodiment of any apparatus embodiment, a method or process embodiment, or even merely a variation of any element of these.

Further, the use of the transitional phrase "comprising" is used to maintain the "open-end" claims herein, according to traditional claim interpretation. Thus, unless the context requires otherwise, it should be understood that the term "comprise" or variations such as "comprises" or "comprising," are intended to imply the inclusion of a stated element or step or group of elements or steps, but not the exclusion of any other element or step or group of elements or steps. Such terms should be interpreted in their most expansive forms so as to afford the applicant the broadest coverage legally permissible in accordance with the following claims.

The language used herein has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the technology of the embodiments of the invention is intended to be illustrative, but not limiting, of the scope of the invention, which is set forth in the following claims.

What is claimed is:

1. A device comprising:

a connector, mechanically and electrically couplable to an outlet;

a diplexer, coupled to the connector, configured to pass a first frequency band associated with a first type of network communications and a second frequency band associated with a second type of network communications, wherein the diplexer comprises a first filter configured to pass the first frequency band and a second filter configured to pass the second frequency band;

a first detector, coupled to the first filter, configured to determine a first DC voltage associated with a power level of the first frequency band, wherein the power level of the first frequency band is based on digitization of the first DC voltage;

a second detector, coupled to the second filter, configured to determine a second DC voltage associated with a power level of the second frequency band, wherein the power level of the second frequency band is based on digitization of the second DC voltage; and a processor, coupled to the diplexer, the first detector, and the second detector, configured to:

receive the power level of the first frequency band and the power level of the second frequency band, compare the power level of the first frequency band and a first threshold value associated with the first type of network communications, and compare the power level of the second frequency band and a second threshold value associated with the second type of network communications.

2. The device of claim 1, wherein the first filter is a band pass filter and the second filter is a band pass filter.

3. The device of claim 1, wherein the first detector is a first log amp and the second detector is a second log amp.

4. The device of claim 1, further comprising:

a power supply, coupled to the first detector, the second detector, and the processor; and a switch, coupled to the power supply, wherein activation of the switch enables operation of the device.

5. The device of claim 1, wherein the first threshold value and the second threshold value are configurable.

6. The device of claim 1, wherein the device is handheld.

7. The device of claim 1, wherein the connector is an F-type connector.

8. The device of claim 1, wherein the first type of network communications is associated with CaTV and the second type of network communications is associated with MoCA.

9. The device of claim 8, wherein the first frequency band is selected to be a subset of an entire spectrum associated with CaTV and the second frequency band is selected to be an entire spectrum associated with MoCA.

10. The device of claim 8, wherein the first threshold value is based on a minimum power level for each channel in the first frequency band and the second threshold value is based on a minimum power level of a beacon in the second frequency band.

11. The device of claim 8, wherein the first frequency band is selected to include channels provided by different cable companies in different geographical regions.

12. A handheld device comprising:

a connector, mechanically and electrically couplable to a coaxial cable outlet in a building;

a multiplexer, coupled to the connector, configured to separate signals at the outlet into a plurality of frequency bands associated with a plurality of types of network communications, the multiplexer comprising a plurality of filters configured to pass the plurality of frequency bands;

a plurality of detectors, coupled to the multiplexer and the plurality of filters, configured to receive the plurality of frequency bands, wherein each detector is configured to determine a DC voltage associated with a power level of an associated frequency band, wherein the power level of the associated frequency band is based on digitization of the DC voltage; and a processor, coupled to the plurality of detectors, configured to perform a comparison of the power level of each frequency band associated with a respective type of network communications with a threshold value associated with the respective type of network communications.

13. The handheld device of claim 12, further comprising a button associated with a switch coupled to the processor, wherein depression of the button when the handheld device is coupled to the outlet causes the handheld device to automatically perform a test to determine the adequacy of signals associated with the plurality of types of network communications at the outlet and to automatically indicate results of the test to a user of the handheld device.

14. A method comprising:

receiving, by a handheld device comprising a connector mechanically and electrically couplable to an outlet, a signal;

separating the signal into a plurality of frequency bands associated with a plurality of types of network communications by filtering the signal to pass the plurality of frequency bands;

detecting a power level of each frequency band of the plurality of frequency bands by determining a DC voltage associated with the power level of the frequency band, wherein the power level of the frequency band is based on digitization of the DC voltage;

comparing the detected power level of each frequency band with an associated threshold value; and indicating to a user of the handheld device whether the detected power level of each frequency band is sufficient for the associated type of network communications.

15. The method of claim 14, wherein the plurality of types of network communications comprise at least one of CaTV or MoCA.

16. The method of claim 14, wherein the associated threshold value is configurable.

17. The handheld device of claim 12, wherein the connector is an F-type connector.

18. The handheld device of claim 12, wherein the plurality of types of network communications comprise at least one of CaTV or MoCA.

19. The device of claim 1, further comprising:

at least a first indicator, coupled to the processor, configured to indicate a result of a comparison between the power level of the first frequency band and the first threshold value; and at least a second indicator, coupled to the processor, configured to indicate a result of a comparison between the power level of the second frequency band and the second threshold value.

20. The device of claim 19, wherein the at least a first indicator comprises a first LED and the at least a second indicator comprises a second LED.

* * * * *